United States Patent
Sherkat et al.

(10) Patent No.: US 10,140,326 B2
(45) Date of Patent: Nov. 27, 2018

(54) PAGED INVERTED INDEX

(71) Applicant: SAP SE, Walldorf (DE)

(72) Inventors: Reza Sherkat, Waterloo (CA); Ivan Schreter, Mannheim (DE); Robert Schulze, Walldorf (DE); Mihnea Andrei, Issy les Moulineaux (FR); Colin Florendo, Marlborough, MA (US); Christian Lemke, Frankfurt (DE); Sebastian Seifert, Weinboehla (DE)

(73) Assignee: SAP SE, Walldorf (DE)

( * ) Notice: Subject to any disclaimer, the term of this patent is extended or adjusted under 35 U.S.C. 154(b) by 365 days.

(21) Appl. No.: 14/954,736

(22) Filed: Nov. 30, 2015

(65) Prior Publication Data
US 2017/0154061 A1 Jun. 1, 2017

(51) Int. Cl.
*G06F 17/30* (2006.01)
*H03M 7/30* (2006.01)

(52) U.S. Cl.
CPC .. *G06F 17/30339* (2013.01); *G06F 17/30336* (2013.01); *G06F 17/30424* (2013.01); *G06F 17/30622* (2013.01); *H03M 7/60* (2013.01)

(58) Field of Classification Search
CPC ............... G06F 17/30339; G06F 17/30424
See application file for complete search history.

(56) References Cited

U.S. PATENT DOCUMENTS

| | | | | |
|---|---|---|---|---|
| 8,874,620 B1 * | 10/2014 | Rohr | ........... | G06F 17/3056 707/803 |
| 2010/0083101 A1 * | 4/2010 | Denoual | ........... | G06F 17/2247 715/242 |

OTHER PUBLICATIONS

Extended European Search Report dated Feb. 23, 2017, for European Application No. 16002521.9; 8 pages.
Hector Garcia-Molina et al., "Database Systems, The Complete Book," Second Edition, Chapter 14, "Index Structures," Department of Computer Science Stanford University, 2009; 85 pages.
Ramez Elmasri and Shamkant B. Navathe, "Fundamentals of Database Systems," Sixth Edition, Chapter 18, "Indexing Structures for Files," 2011; 50 pages.
Goetz Graefe et al., "A Hybrid Page Layout Integrating PAX and NSM," HP Laboratories, 2012; 13 pages.

* cited by examiner

*Primary Examiner* — Grace Park
(74) *Attorney, Agent, or Firm* — Sterne, Kessler, Goldstein & Fox P.L.L.C.

(57) ABSTRACT

Disclosed herein are system and method embodiments for generating a paged inverted index. An embodiment is generated by storing a first data structure and the second data structure in a plurality of pages, where the plurality of pages are stored in the one or more memories. The first data structure is stored in the plurality of pages and includes a plurality of value identifiers, where a value identifier corresponds to an offset. The second data structure stored in the plurality of pages includes a plurality of row positions, wherein a row position is at a location that corresponds to the offset in the first data structure and identifies a position of row in a table that stores data associated with the value ID.

20 Claims, 8 Drawing Sheets

PAGED INVERTED INDEX

BACKGROUND

A database table may store data in rows and columns. When data is stored in columns, a column of values may be represented as a sequence of value IDs. A search for a value queries the database table and identifies the rows conditioned on the particular value ID. A database processes a query by searching a table and an index that is associated with the table. An index may provide a mapping between one or more value IDs and rows in a database table. Conventionally, a database loads an entire index into the database memory, which results in faster data access and retrieval. However, because the size of the index stored in the database memory is proportional to the size of the underlying value ID sequence, the index may have large memory foot print, which means the memory space in the database memory cannot be used for other database operations.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Provided herein are systems and method embodiments, and/or combinations and sub-combinations thereof, for generating a paged inverted index and for utilizing the paged inverted index to obtain data stored in a database table.

Figure 1:
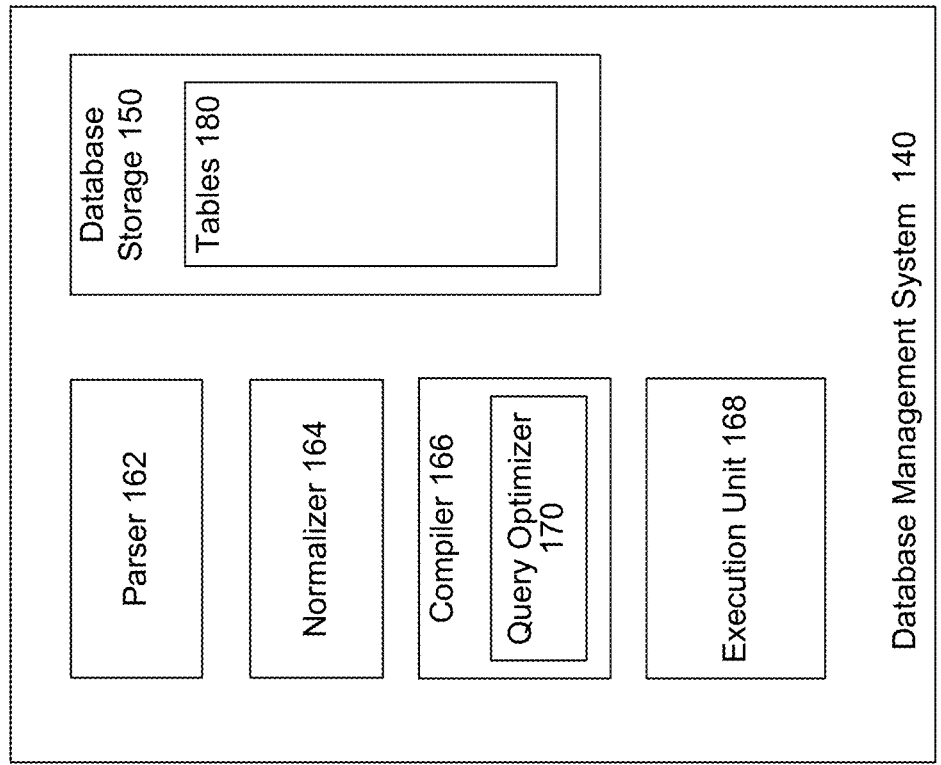
FIG. 1 is a block diagram of a database system that includes a paged inverted index, according to an example embodiment.
Figure 1:
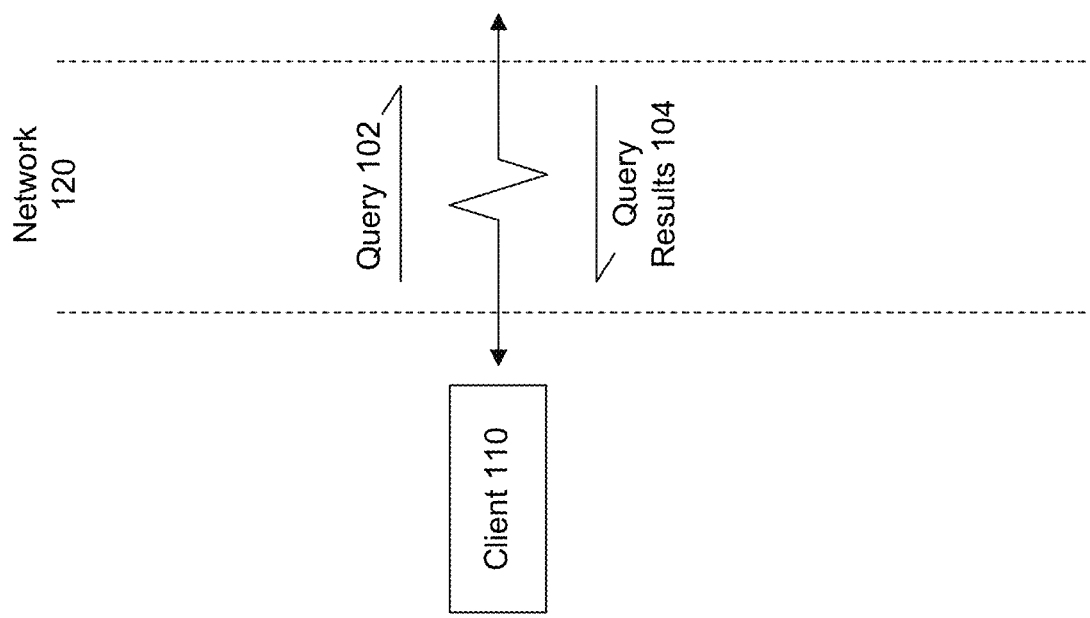

FIG. 1 is a block diagram 100 of a database system that includes a paged inverted index, according to an embodiment. Database system 100 includes a database management system (DBMS) 140 and client 110 that communicates with DBMS 140. DBMS 140 may be a system executing on a server and accessible to client 110 over a network, such as network 120, described below. Although client 110 is represented in FIG. 1 as a separate physical machine from DBMS 140, this is presented by way of example, and not limitation, as client 110 may also occupy the same physical system as DBMS 140. In a further embodiment, client 110 may be software application which accesses DBMS 140, or may be a user operated device that requests access to DBMS 140. Additionally, both client 110 and DBMS 140 may execute within a computer system, such as an example computer system discussed in FIG. 8.

Client 110 and DBMS 140 may communicate over network 120. Network 120 may be any network or combination of networks that carry out data communications. Example network 120 may include, but is not limited to, a local area network, a metropolitan area network, a wide area network that includes the Internet, a combination of any of the above, etc.

In an embodiment, DBMS 140 stores data in one or more database tables (or simply tables 180) in database storage 150. Tables 180 may be stored in a row or column format. Additionally, tables 180 may be stored "in-memory" of DBMS 140 where entire table 180 is stored in cache or RAM memory. A database query, or simply query 102 is a request to modify, update, delete, append, or otherwise manipulate data stored in the tables 180. In an embodiment, query 102 may be issued by client 110 or be a routine or a subroutine that is executed within DBMS 140 once or at predefined intervals.

In an embodiment, query 102 is written using a particular syntax which conforms to a query language. In a non-limiting embodiment, the query language is a Structured Query Language ("SQL"), but may be another query language. DBMS 140 is able to interpret query 102 in accordance with the query language and, based on the interpretation, generate requests to database storage 150.

In an embodiment, query 102 may be generated by a user using client 110 or by an application executing on client 110. Upon receipt, DBMS 140 begins to process query 102. Once processed, the result of the processed query is transmitted to client 110 as query result 104.

To process query 102, DBMS 140 includes a parser 162, a normalizer 164, a compiler 166, and an execution unit 168.

In an embodiment, parser 162 parses the received queries 102. In an embodiment, parser 162 may convert query 102 into a binary tree data structure which represents the format of query 102. In other embodiments, other types of data structures may be used.

When parsing is complete, parser 162 passes the parsed query to a normalizer 164. Normalizer 164 normalizes the parsed query. For example, normalizer 164 eliminates redundant SQL constructs from the parsed query. Normalizer 164 also performs error checking on the parsed query that confirms that the names of the tables in the parsed query conform to the names of tables 180. Normalizer 164 also confirms that relationships among tables 180, as described by the parsed query, are valid.

Once normalization is complete, normalizer 164 passes the normalized query to compiler 166. Compiler 166 compiles the normalized query into machine-readable format. The compilation process determines how query 102 is executed by DBMS 140. To ensure that query 102 is executed efficiently, compiler 166 uses a query optimizer 170 to generate an access plan for executing the query.

Query optimizer 170 analyzes the query and determines a query plan for executing the query. The query plan retrieves and manipulates information in the database storage 150 in accordance with the query semantics. This may include choosing the access method for each table accessed, choosing the order in which to perform a join operation on the tables, and choosing the join method to be used in each join operation. As there may be multiple strategies for executing a given query using combinations of these operations, query optimizer 170 generates and evaluates a number of strategies from which to select the best strategy to execute the query.

Execution unit 168 executes a query plan for query 102 on one or more tables 180, and retrieves data from one or more tables 180. As part of the execution, execution unit 168 also executes the query plan on the indexes that are set on one or more tables 180, such as the indexes described below. For example, each table 180 includes one or more columns, and/or one or more rows. In an embodiment, a column in table 180 may be represented as an inverted index, as shown in FIGS. 2A-C and 3.

Figure 2A:
FIG. 2A is a block diagram of a column in a database table, according to an example embodiment.

FIG. 2A is a block diagram of column 200A in a database table, according to an embodiment. Column 200A may be one of the columns in table 180. Column 200A may store data of a particular type and/or a particular category, such as, data pertaining to first name, last name, address, zip code, to name a few examples. In a non-limiting embodiment, column 200A may include a listing of city names, as shown in FIG. 2A.

Figure 2B:
FIG. 2B is a block diagram of a directory associated with a column, according to an embodiment.

FIG. 2B is a block diagram of a dictionary 200B associated with column 200A, according to an embodiment. In dictionary 200B, each unique value in column 200A may be mapped to a unique value identifier or value ID. In an example embodiment of dictionary 200B, "Dresden" may be assigned a valued ID=0, "Köln" may be assigned a value ID=1, and "Mannheim" may be assigned a valued ID=2.

Figure 2C:
FIG. 2C is a block diagram of a value ID vector, according to an embodiment.

FIG. 2C is a block diagram of a value ID vector 200C, according to an embodiment. Value ID vector 200C represents data in column 200A. As shown in FIG. 2C, value ID vector 200C represents data in column 200A, but with a value ID specified in dictionary 200B substituted for each data row in column 200A.

In an embodiment, value ID vector 200C includes row positions and value IDs that are associated with each row position. For example, value ID vector 200C includes row positions {0, 1, 2, 3, 4, 5}, and value ID's {2, 1, 0, 1, 2, 2} that are mapped to each row position, as shown in FIG. 2C, where the value IDs map to column 200A as shown in dictionary 200B.

In an embodiment, value ID vector 200C has a smaller memory foot print than column 200A. Because of the smaller memory foot print, DBMS 140 may store value ID vector 200C in database memory or "in-memory," such as database storage 150. The memory may be cache or RAM memory that is described in FIG. 8.

In an embodiment, one or more components in DBMS 140 (collectively referred to as DBMS 140) may use value ID vector 200C to determine the rows in column 200A that store a particular value. For example, when DBMS 140 receives a query that requests all instances of "Manheim" in column 200A, DBMS 140 may find all rows that contain "Manheim" from value ID vector 200C. To find all rows, first DBMS 140 finds the value ID for "Manheim" in dictionary 200B. In the example shown in FIG. 2B, the value ID=2 corresponds to "Manheim." Next, DBMS 140 traverses value ID vector 200C for one or more row positions where value ID=2 and identifies rows 0, 4, and 5, which are the results of the query.

Figure 3:
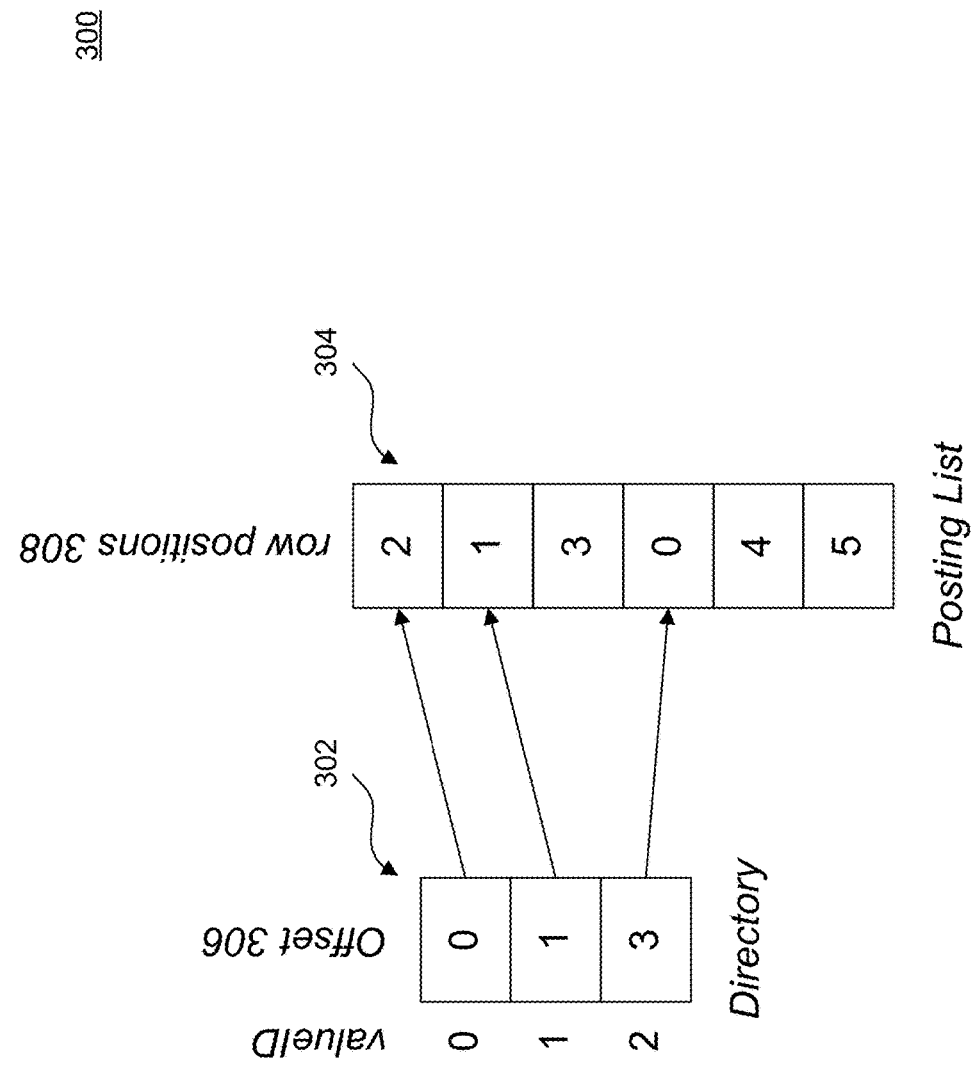
FIG. 3 is a block diagram of an inverted index, according to an embodiment.

In a further embodiment, the search of the value ID vector 200C may be optimized. To optimize the search, DBMS 140 may construct an inverted index from value ID vector 200C. FIG. 3 is a block diagram of an inverted index 300, according to an embodiment. Inverted index 300 may include a first vector 302 and a second vector 304. In a further embodi-ment, first vector 302 may be called a directory, and second vector 304 may be called a posting list.

In an embodiment, first vector 302 stores one or more offsets, such as offset 306. Each offset 306 is an offset to an entry in second vector 304. In an embodiment, the first entry may be at a zero$^{th}$ position in second vector 304. Example first vector 302 in FIG. 3 includes three values for offset 306: 0, 1, and 3. Offset=0 indicates that value ID=0 starts from the zero$^{th}$ position in second vector 304; Offset=1 indicates that a list with value ID=1 starts from the first position in second vector 304; and offset=3 indicates that a list with value ID=2 starts from the third position in second vector 304.

In an embodiment, second vector 304 is a sequence of row positions 308 in column 200A, where row positions having identical value IDs are next to each other. For example, as shown in FIG. 3, if value ID=2 appears in row positions 0, 4, and 5 in value ID vector 200C, then values 0, 4, and 5 are next to each other in second vector 304, at the third, fourth and fifth row positions.

In order to find rows in column 200A that are mapped to valueID=2, DBMS 140 uses the first vector 302 to determine an offset having valueID=2. As shown in FIG. 3, the offset of valueID=2 is equal to three. Once DBMS 140 determines the offset, DBMS 140 applies the offset to second vector 304, and determines the row positions in second vector 304. For example, DBMS 140 subtracts offset=3 from the beginning of second vector 304, and identifies rows 0, 4, and 5 which correspond to valueID=2.

Figure 4:
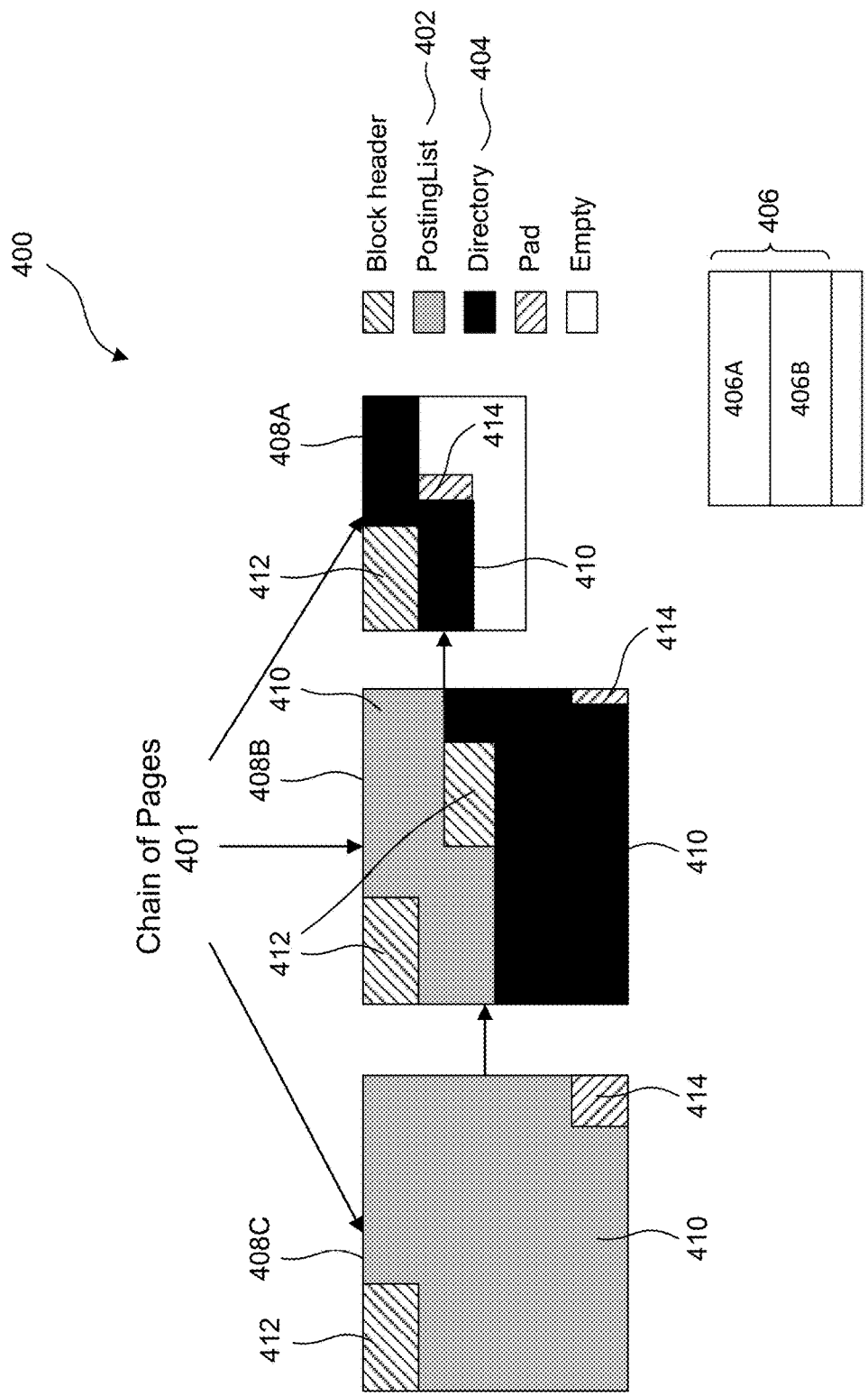
FIG. 4 is a block diagram of a paged inverted index, according to an embodiment.

In an embodiment, to reduce the memory foot print of inverted index 300, inverted index 300 may be converted to a paged inverted index. FIG. 4 is a block diagram of a paged inverted index 400, according to an embodiment. Paged inverted index 400 stores inverted index 300 as a chain of pages 401. Some of the pages in paged inverted index 400 may be stored in database storage 150 and can be quickly accessed by DBMS 140, while other pages of paged inverted index 400 may be stored outside of DBMS 140, in for example disk memory (also described in FIG. 8). Pages that are stored outside of DBMS 140, are first loaded into database storage 150 and possibly into memory before DBMS 140 can access data in these pages.

In an embodiment, paged inverted index 400 may be used to retrieve row positions for columns that are requested by query 102. One difference between inverted index 300 and paged inverted index 400 is that DBMS 140 may retrieve row positions from paged inverted index 400 without keeping entire paged inverted index 400 in main memory of database storage 150.

In an embodiment, paged inverted index may be implemented as a chain of pages 401. Chain of pages 401 includes pages, such as pages 408A-C which store data structures in paged inverted index 400.

In an embodiment, paged inverted index 400 may include data structures, such as, a posting list 402 and a directory 404. Posting list 402 may store a sequence of row positions of value occurrences in the original value ID vector 200C. Directory 404 may store one or more offsets to posting list 402 for each value ID. Each offset identifies the first position in posting list 402 that stores a value ID.

In an embodiment, to determine a list of row positions in posting list 402 given a particular value ID (the search value), DBMS 140 determines the first offset and the second offset. The first offset points to a position in posting list 402 where the first row in table 180 that stores the search value is located. The second offset points to a position in posting list 402 where the last row that stores the search value in table 180 is located (or the next row that stores a different value ID after the search value, depending on an implementation or embodiment). In an embodiment, DBMS 140 retrieves the first offset and the second offset from directory 404. Next, DBMS 140 reads the row positions in posting list 402 beginning with the first offset and ending before or at the second offset (depending on the implementation or embodiment).

In an embodiment, posting list 402 and directory 404 may be stored in a compressed format. For example, posting list 402 and directory 404 may be stored using binary compression. In binary compression, posting list 402 may be compressed as a sequence of n-bit values, where "n" is a number of bits required to encode the largest value in posting list 402. As such, "n" may vary between different posting lists 402, depending on the largest value in each posting list 402.

In a further embodiment, directory 404 may be compressed using a sequence of m-bit values, where "m" is a number of bits required to encode the size of directory 404, which is the value of the largest possible offset.

In an embodiment, posting list 402 and directory 404 are stored in pages in a chained page list or a chain of pages 401. In a further embodiment, depending on size of posting list 402, directory 404 and each page in chain of pages 401, posting list 402 and directory 404 may be stored in a single page of paged inverted index 400 (not shown).

In a further embodiment, directory 404 may follow posting list 402.

In a further embodiment, paged inverted index 400 may include metadata 406. Metadata 406 describes data in paged inverted index 400, and may be included in a block after directory 404.

As discussed above, paged inverted index 400 may be implemented as one or more pages, such as pages 408A-C. Each page may be a set of one or more blocks 410. Each block may begin with a block header 412 and includes either posting list 402 or directory 406.

In a further embodiment, an inverted index, such as, inverted index 300, may be a unique inverted index. In a unique inverted index each value ID corresponds to one row position. Because each value ID corresponds to one row position, a unique inverted index does not need directory 404. When a unique inverted index is converted to a paged inverted index 400, directory 404 is not specified because each value ID corresponds to one row position, and in this case, unique paged inverted index requires posting lost 402 without directory 404.

As described above, paged inverted index 400 includes metadata 406. In an embodiment, posting list 402 or directory 404 may each be associated with a separate metadata 406. For example, posting list 402 may be associated with metadata 406A and directory may be associated with metadata 406B. Metadata 406 may be stored in one of pages 408A-C in paged inverted index 400 (not shown).

In an embodiment, metadata 406 may include a basis page number. The basis page number is a logical page number of the first page that contains the first block of the corresponding paged data structure, such as, posting list 402 or directory 404. In an embodiment, metadata 406 stores a logical page for posting list 402 and a logical page for directory 404.

In an embodiment, metadata 406 may include a byte offset to the first block on the first page. A byte offset to the first page is an offset (which may be in bytes) to the first block in a page in chain of pages 401 having the basis page number.

In an embodiment, metadata 406 may include an entries counter. The entries counter indicates a total number of entries included in posting list 402 or directory 404.

In an embodiment, metadata 406 may include a bits per entry parameter. The bits per entry parameter includes a number of bits used to encode (or compress) each entry in posting list 402 or directory 404.

In an embodiment, metadata 406 may include a page size parameter. The page size parameter includes a page size of each page in chain of pages 401 containing the paged data structure, such as posting list 402 or directory 404.

In an embodiment, metadata 406 may include a block header size parameter. The block header size includes a size of each block header 412.

In a further embodiment, the end of each page in chain of pages 401 may be padded with empty space 414. The size of empty space 414 depends on a number of bits per entry in block 410. In an embodiment, the size of empty space 414 may be at most seven bytes.

In a further embodiment, the last page of chain of pages 401, such as page 408A, may have a smaller size than the other pages, such as pages 408B-C. For example, to avoid underutilization of a page in paged inverted index 400, and to conserve memory space in database storage 150, the size of page 408A may be large enough to hold a corresponding data structure (posting list 402, directory 404, or both). As a result the size of page 408A may be smaller than other pages, such as pages 408B-C.

As discussed above, paged inverted index 400 includes block header 412. In an embodiment, block header 412 includes a count parameter. The count parameter indicates a number of values in block 410 that follow block header 412.

In an embodiment, block header 412 includes a compression flag. The compression flag indicates whether data stored in block 410 is compressed data or uncompressed data. For example, a flag may be set to "zero" when data is compressed and "one" when data is not compressed, or vice versa.

In an embodiment, block header 412 also includes a bits per value parameter. The bits per value parameter indicates a number of bits that were used to compress a value.

In an embodiment, block header 412 includes a block type parameter. The block type parameter indicates whether block 410 stores posting list 402 or directory 404.

In an embodiment, block header 412 also includes reserved space. The reserved space may be used to include additional parameters in block header 412.

In an embodiment, DBMS 140 may execute query 102 on paged inverted index 400, such that query 102 identifies a row position in posting list 402 that stores a search value specified in query 102. To execute query 102, DBMS 140 first extracts a value ID of the search value from dictionary. Next, DBMS 140 determines a first offset and a second offset in directory 404 that point to a section in posting list 402 where value ID and value ID+1 begin.

In an embodiment, to determine the first offset and the second offset, DBMS 140 first identifies a page in chain of pages 401 that includes a section of directory 404 storing the value ID. In an embodiment, DBMS 140 may use metadata 406 to identify the page, as discussed below.

If the value ID is not more than NumValueIdsFirstPage determined using Equation #1 below:

(Equation #1)

$$NumValueIdsFirstPage = \left\lfloor \frac{PageSize - (BlockHeaderSize + ByteOffsetFirstPage)}{BitsPerEntry} \right\rfloor$$

DBMS 140 loads a page of paged inverted index 400 that has a logical page number of a basis page number (which is stored in metadata 406) into database storage 150.

Otherwise, if the value of NumValueIdsFirstPage is greater than value ID, then DBMS 140 determines the NumValueIdsPerPage parameter as indicated below, using Equation #2:

$$NumValueIdsPerPage = \left\lfloor \frac{PageSize - BlockHeaderSize}{BitsPerEntry} \right\rfloor \quad \text{(Equation \#2)}$$

The NumValueIdsPerPage parameter indicates a number of value IDs that are stored in each page in chain of pages 401.

From the NumValueIdsPerPage parameter, DBMS 140 determines the page number, PageNo, as indicated below using Equation #3:

$$PageNo = \left\lfloor \frac{valueID - NumberOfValueIDsFirstPage}{NumValueIdsPerPage} \right\rfloor \quad \text{(Equation \#3)}$$

Once DBMS 140 determines the page number (PageNo), which corresponds to a logical number of a page in paged inverted index 400, DBMS 140 either checks if the determined page is in database storage 150, or if not, loads the page that corresponds to the logical page number from paged inverted index 400 into database storage 150 or memory.

Once loaded, DBMS 140 reads the bit-packet offset corresponding to value ID as the first offset, and the bit-packed offset corresponding to valueID+1 as the second offset.

In an embodiment, once DBMS 140 determines the first offset and the second offset, DBMS 140 uses the first offset and the second offset to determine the row positions in posting list 402. The algorithm replicated below, is one of the embodiments that DBMS 140 uses to determine the row positions:

For all offsets "o" with offset1≤o≤offset2
  a. find the directory page with pageNo that contains "o"
  b. read paged inverted index with logical page number of pageNo
  c. read compressed row pos at the following offset from the loaded page
  PageBaseOffset="o" remainder NumValueIdsPerPage As shown in the algorithm replicated above, DBMS 140 reads a row position from posting list 402 for all offsets between and equal to the first offset and the second offset. First, DBMS 140 identifies a page from pages in chain of pages 401 that includes directory 406 that stores a logical page number that includes offset "o", where "o" is an offset between (or equal to) the first offset and the second offset. In an embodiment, DBMS 140 identifies the page as discussed above using Equations #1 and #2.

Once DBMS 140 identifies the page in chain of pages 401, DBMS 140 determines whether the page is stored in database storage 150. When the identified page is stored in database storage 150, DBMS 140 reads the identified page. When the identified page is not stored in database storage 150, DBMS 140 loads the identified page into DBMS 140 and reads the identified page.

Next, DBMS 140 reads the compressed row position (when the identified page is in a compressed format) or the uncompressed row position (when the identified page is not in the compressed format) from the identified page. Whether the page is compressed or not compressed may be determined from the block header 412 associated with the identified block. Once the row position is read, DBMS 140 access data in the table at the row position read from the identified page.

As discussed above, DBMS 140 repeats the process and identifies row positions for each offset between or equal to the first offset and the second offset.

Figure 5:
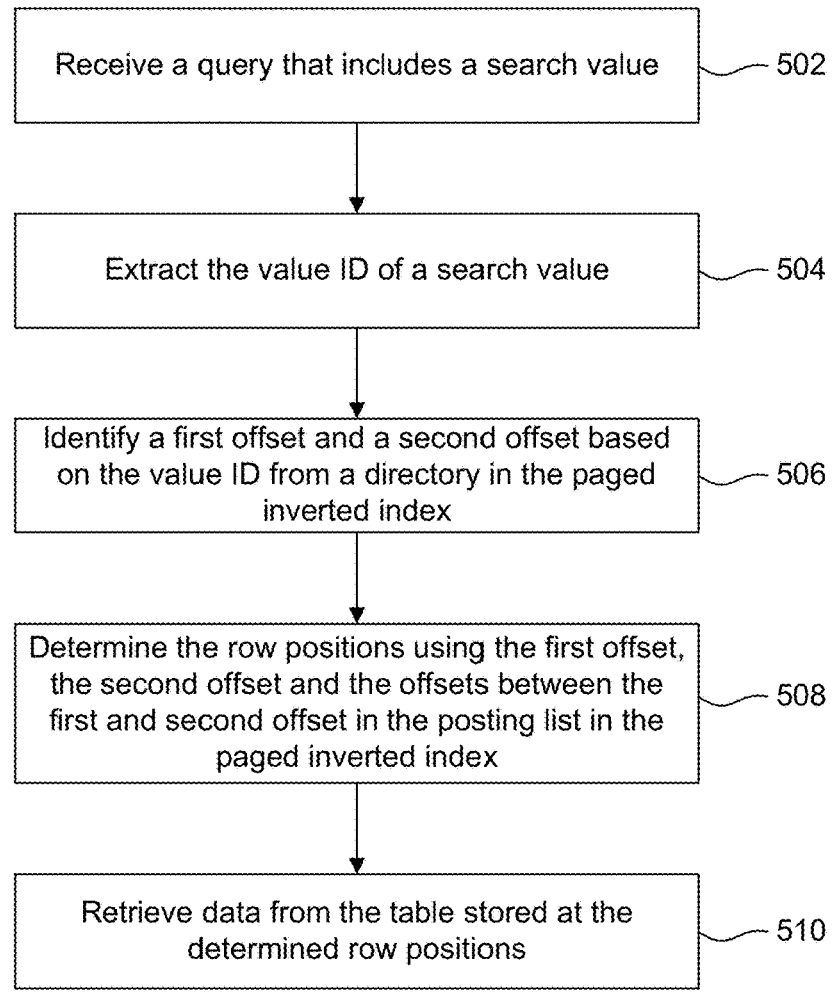
FIG. 5 is a method for evaluating a query using a paged inverted index, according to an embodiment.

FIG. 5 is a method 500 for evaluating a query using paged inverted index, according to an embodiment. Method 500 can be performed by processing logic that can comprise hardware (e.g., circuitry, dedicated logic, programmable logic, microcode, etc.), software (e.g., instructions executing on a processing device), or a combination thereof.

In step 502, DBMS 140 receives a query. The query, such as query 102 includes a search value that causes DBMS 140 to retrieve data from table 180 that is optimized for accesses using paged inverted index 400.

In step 504, DBMS 140 extracts the value ID of a search value. In an embodiment, the value ID may be extracted using a dictionary.

In step 506, DBMS 140 identifies a first offset and a second offset stored in the directory. The details of step 508 are discussed in detail in FIG. 6.

In step 508, DBMS 140 retrieves row positions from the posting list using the offsets between the first offset and the second offset. Step 508 is discussed in detail in FIG. 7.

In step 510, DBMS 140 retrieves data from the table. For example, DBMS 140 uses the row positions retrieved from posting list 402 to access table 180 and retrieve the data from table 180 that is stored in the retrieved row positions in the table.

Figure 6:
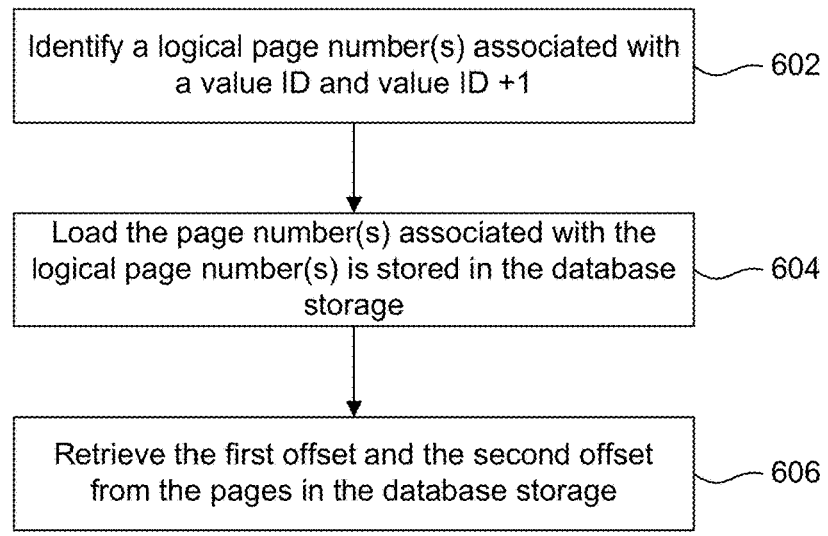
FIG. 6 is a method for determining a first offset and a second offset in a directory of a paged inverted index, according to an embodiment.

FIG. 6 is a method 600 for determining a first offset and a second offset, according to an embodiment. Method 600 can be performed by processing logic that can comprise hardware (e.g., circuitry, dedicated logic, programmable logic, microcode, etc.), software (e.g., instructions executing on a processing device), or a combination thereof.

At step 602, DBMS 140 identifies a logical page number of a page in a directory. As discussed above, directory 406 stores offsets associated with a value ID and value ID+1. Because directory 406 is stored as a collection of linked pages and some of these pages may or may not be stored in database storage 150, DBMS 140 identifies one or more page numbers in directory 406 that stores the value ID and value ID+1 parameters, that correspond to the first offset and the second offset, and uses the logical page number to determine the pages in chain of pages 401.

At step 604, DBMS 140 determines whether the page is stored in the database storage. From the logical page number determined in step 602, DBMS 140 identifies a page from pages 408A-C and determines whether the identified page is stored in database storage 150. When the identified page is not stored in database storage 150, DBMS 140 loads the identified page into database storage 150. In an embodiment, where the first offset is on a different page from the second offset, DBMS 140 determines whether all pages that include the first offset, the second offset, and the offsets in between the first offset and the second offset, are stored in database storage 150 and loads the identified pages in database storage if they are stored in another memory.

At step 606, DBMS 140 retrieves the first offset and the second offset. For example, DBMS 140 retrieves the first offset that corresponds to the value ID and the second offset that corresponds to the value ID+1 from the identified page(s) stored in DBMS 140.

Figure 7:
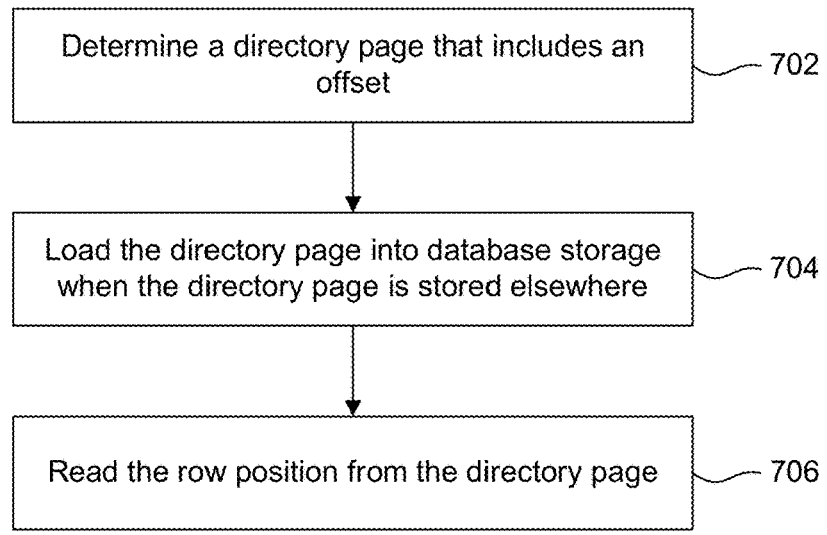
FIG. 7 is a method for determining row positions in a posting list of a paged inverted index, according to an embodiment.

FIG. 7 is a method 700 for retrieving row positions, according to an embodiment. Method 700 can be performed by processing logic that can comprise hardware (e.g., circuitry, dedicated logic, programmable logic, microcode, etc.), software (e.g., instructions executing on a processing device), or a combination thereof. In an embodiment, method 700 repeats for the offsets that are equal to and/or between the first offset and the second offset identified in step 506.

In step 702, DBMS 140 determines a directory page that includes an offset. As discussed above, the offset may be an offset between a first offset and a second offset that were determined in step 506. To determine the page DBMS 140 determines a logical page number that includes the offset. To determine the logical page, DBMS 140 may use Equations #1-#3, but replace the value ID parameter with an offset parameter.

In step 704, DBMS loads the determined page. For example, DBMS 140 determines whether the page determined in step 702 is stored in database storage 150. If the page is not stored in database storage 150, DBMS 140 loads the determined page into database storage 150.

In step 706, DBMS reads the row position from the page. For example, DBMS 140 reads the row position that corresponds to an offset from the page identified in step 702 and loaded into database storage 150 in step 704.

Figure 8:
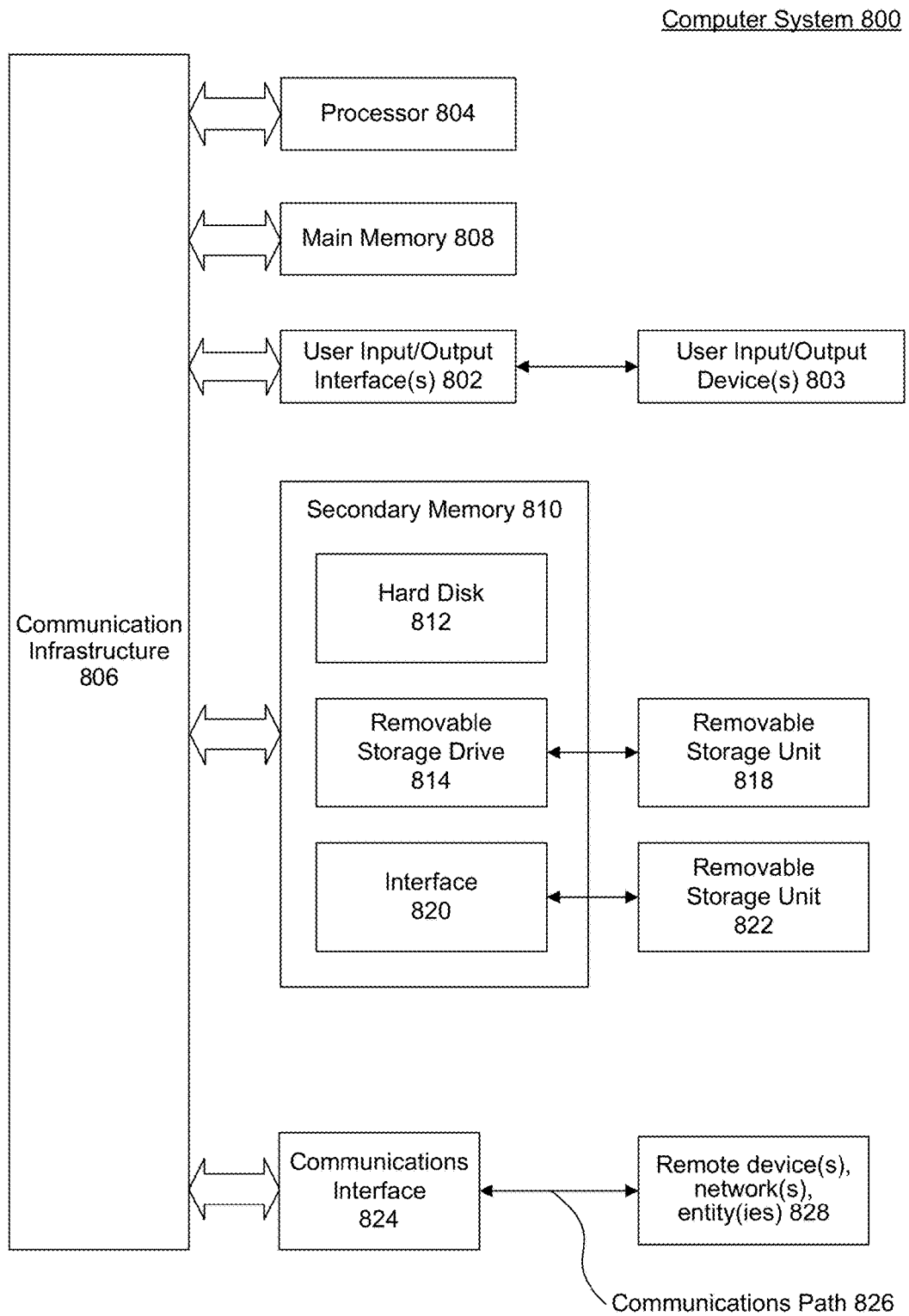
FIG. 8 is an example computer system useful for implementing various embodiments.

Various embodiments can be implemented, for example, using one or more well-known computer systems, such as computer system 800 shown in FIG. 8. Computer system 800 can be any well-known computer capable of performing the functions described herein.

Computer system 800 includes one or more processors (also called central processing units, or CPUs), such as a processor 804. Processor 804 is connected to a communication infrastructure or bus 806.

One or more processors 804 may each be a graphics processing unit (GPU). In an embodiment, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 800 also includes user input/output device(s) 803, such as monitors, keyboards, pointing devices, etc., that communicate with communication infrastructure 806 through user input/output interface(s) 802.

Computer system 800 also includes a main or primary memory 808, such as random access memory (RAM). Main memory 808 may include one or more levels of cache. Main memory 808 has stored therein control logic (i.e., computer software) and/or data.

Computer system 800 may also include one or more secondary storage devices or memory 810. Secondary memory 810 may include, for example, a hard disk drive 812 and/or a removable storage device or drive 814. Removable storage drive 814 may be a floppy disk drive, a magnetic tape drive, a compact disk drive, an optical storage device, tape backup device, and/or any other storage device/drive.

Removable storage drive 814 may interact with a removable storage unit 818. Removable storage unit 818 includes a computer usable or readable storage device having stored thereon computer software (control logic) and/or data. Removable storage unit 818 may be a floppy disk, magnetic tape, compact disk, DVD, optical storage disk, and/any other computer data storage device. Removable storage drive 814 reads from and/or writes to removable storage unit 818 in a well-known manner.

According to an exemplary embodiment, secondary memory 810 may include other means, instrumentalities or other approaches for allowing computer programs and/or other instructions and/or data to be accessed by computer system 800. Such means, instrumentalities or other approaches may include, for example, a removable storage unit 822 and an interface 820. Examples of the removable storage unit 822 and the interface 820 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 800 may further include a communication or network interface 824. Communication interface 824 enables computer system 800 to communicate and interact with any combination of remote devices, remote networks, remote entities, etc. (individually and collectively referenced by reference number 828). For example, communication interface 824 may allow computer system 800 to communicate with remote devices 828 over communications path 826, which may be wired and/or wireless, and which may include any combination of LANs, WANs, the Internet, etc. Control logic and/or data may be transmitted to and from computer system 800 via communication path 826.

In an embodiment, a tangible apparatus or article of manufacture comprising a tangible computer useable or readable medium having control logic (software) stored thereon is also referred to herein as a computer program product or program storage device. This includes, but is not limited to, computer system 800, main memory 808, secondary memory 810, and removable storage units 818 and 822, as well as tangible articles of manufacture embodying any combination of the foregoing. Such control logic, when executed by one or more data processing devices (such as computer system 800), causes such data processing devices to operate as described herein.

Based on the teachings contained in this disclosure, it will be apparent to persons skilled in the relevant art(s) how to make and use embodiments of the invention using data processing devices, computer systems and/or computer architectures other than that shown in FIG. 8. In particular, embodiments may operate with software, hardware, and/or operating system implementations other than those described herein.

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A system, comprising:
   one or more memories;
   an in-memory database management system coupled to the one or more memories and configured to:
      store a paged inverted index as a plurality of pages comprising:
         a first data structure,
            wherein the first data structure stores a plurality of value identifiers and a plurality of offsets, and
            wherein a value identifier of the plurality of value identifiers corresponds to an offset in the plurality of offsets, and
         a second data structure,
            wherein the second data structure stores a plurality of row positions,
            wherein a row position in the plurality of row positions is at a location in the second data structure that corresponds to the offset stored in the first data structure, and
            wherein the row position identifies a row position in a database table that stores data associated with the value identifier; and
   an execution engine configured to:
      execute on a processor coupled to the one or more memories;
      access the paged inverted index; and
      determine the row position in the database table that stores the data associated with the value identifier.

2. The system of claim 1, wherein the paged inverted index further comprises:
   a first block included in a first page in the plurality pages, wherein the first block stores the first data structure;
   a second block included in a second page in the plurality of pages, wherein the second block stores the second data structure; and
   a third block and a fourth block included in a third page in the plurality of pages, wherein the third block stores the first data structure and the fourth block stores the second data structure.

3. The system of claim 2, wherein the paged inverted index further comprises:
   a block header configured to store information associated with the first data structure stored in the first block, wherein the block header facilitates access to the plurality of value identifiers stored in first data structure.

4. The system of claim 2, wherein the paged inverted index further comprises:
   a block header associated with the first block, and configured to store a number of values in a portion of the first data structure stored in the first block.

5. The system of claim 1, wherein data in the first data structure is compressed using binary compression that corresponds to a number of bits that encode a value of the largest offset.

6. The system of claim 1, wherein data in the second data structure is compressed using binary compression that corresponds to a largest value in the second data structure.

7. The system of claim 1, wherein the paged inverted index further comprises:
   metadata configured to store a first logical page associated with the first data structure, wherein the first logical page corresponds to a block in the one or more blocks that stores a first page of the first data structure.

8. The system of claim 1, wherein the one or more memories that store the plurality of pages include a memory of an in-memory database and a memory outside of the in-memory database, and wherein the execution engine is further configured to load a page in the plurality of pages that stores the offset of the first data structure or the row position in the second data structure into the memory of the in-memory database prior to accessing the page.

9. A method, comprising:
   allocating memory space in one or more memories for a plurality of pages;
   storing, by an in-memory database system coupled to the one or more memories, a paged inverted index in the plurality of pages, wherein the paged inverted index comprises:
      a first data structure,
         wherein the first data structure comprises a plurality of value identifiers and a plurality of offsets, and
         wherein a value identifier of the plurality of value identifiers corresponds to an offset of the plurality of offsets; and
      a second data structure,
         wherein the second data structure stores a plurality of row positions,
         wherein a row position in the plurality of row positions is at a location in the second data structure that corresponds to the offset stored in the first data structure and
         wherein the row position identifies a row position in a database table stores data associated with the value identifier, and
   wherein an execution engine accesses the paged inverted index and determines the row position in the database table that stores the data associated with the value identifier.

10. The method of claim 9, further comprising:
    storing a first block in a first page in the plurality of pages, wherein the first block stores the first data structure;

storing a second block in a second page in the plurality of pages, wherein the second block stores the second data structure; and storing a third block and a fourth block in a third page in the plurality of pages, wherein the third block stores the first data structure and the fourth block stores the second data structure.

11. The method of claim 10, further comprising:

storing a block header associated with the first block that stores the first data structure, wherein the block header facilitates access to the plurality of value identifiers stored in first data structure.

12. The method of claim 10, further comprising:

storing in a block header associated with the first block, a number of values in a portion of the first data structure stored in the first block.

13. The method of claim 9, further comprising:

compressing data in the first data structure using binary compression, wherein the binary compression corresponds to a number of bits that encode a value of the largest offset.

14. The method of claim 9, further comprising:

compressing data in the second data structure using binary compression, wherein the binary compression corresponds to a largest value in the second data structure.

15. The method of claim 9, further comprising:

storing in metadata associated with the paged inverted index, a first logical page associated with a first data structure, wherein the first logical page corresponds to a block in the one or more blocks that stores a first page of the first data structure.

16. The method of claim 9, further comprising:

storing in metadata associated with the paged inverted index, a number of bits used to compress data in the first data structure.

17. A system, comprising:

an in-memory database management system coupled to one or more memories;

a paged inverted index stored in the one or more memories comprising a plurality of pages configured to store a first data structure and a second data structure,
wherein the first data structure stores a plurality of offsets and a plurality of value identifiers, wherein a value identifier in the plurality of value identifiers corresponds to an offset in the plurality of offsets, wherein the second data structure stores a plurality of row positions, wherein a row position in the plurality of row positions is at a location in the second data structure that corresponds to the offset stored in the first data structure, and a processor comprising operations configured to:

receive a query request for data stored in a database table;

determine, using the first data structure in the paged inverted index, a first offset and a second offset from the plurality of offsets;

determine a row position in the second data structure using the first offset and the second offset, wherein the row position identifies a row position in the database table that stores the data; and access the data in the database table at the row position.

18. The system of claim 17, wherein to determine the first offset, the processor is further configured to:

identify a page in the plurality of pages of the paged inverted index that stores the first offset;

determine when the page is stored in the one or more memories that are in-memory of the database; and based on the determination retrieve the first offset when the page is stored in-memory.

19. The system of claim 18, wherein the processor is further configured to:

based on the determination, load the page into the one or more memories prior to retrieving the first offset.

20. The system of claim 18, wherein to identify the page in the paged inverted index that stores the first offset, the processor is further configured to:

determine a logical page number of the first data structure using a value identifier of the data associated with the first offset; and determine the page in the paged inverted index that stores the logical page number.

* * * * *